US006486556B1

(12) United States Patent
Lee et al.

(10) Patent No.: US 6,486,556 B1
(45) Date of Patent: Nov. 26, 2002

(54) INTERCONNECTION LAYER LAYOUT COMPRISING CUT-OUT CONDUCTIVE LINES THAT ENSURE PROPER PROFILE OF OVERLYING PASSIVATION LAYER

(75) Inventors: Kweon-Jae Lee, Suwon (KR); Weon-Chul Hong, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 63 days.

(21) Appl. No.: 09/671,213

(22) Filed: Sep. 28, 2000

(30) Foreign Application Priority Data

Oct. 1, 1999 (KR) .............................................. 99-42257

(51) Int. Cl.$^7$ .............................................. H01L 23/52
(52) U.S. Cl. ...................................... 257/752; 257/753
(58) Field of Search ................................ 257/203, 208, 257/210–211, 256, 296, 640, 649, 752–753, 758, 760

(56) References Cited

U.S. PATENT DOCUMENTS 5,608,257 A * 3/1997 Lee et al. .................... 257/529

FOREIGN PATENT DOCUMENTS

JP 62162353 A * 7/1987

* cited by examiner

*Primary Examiner*—Minh Loan Tran
*Assistant Examiner*—Thomas L Dickey
(74) *Attorney, Agent, or Firm*—Volentine Francos, PLLC

(57) ABSTRACT

A layout structure of the interconnection layers of a semiconductor device includes a plurality of conducting lines extending adjacent one another, and at least one rectangular cut-out formed in a side of each of the conducting lines, wherein a width of gap between adjacent ones of the plurality of conducting lines is increased at each rectangular cut-out. The rectangular cut-out serves to increase the space between adjacent conducting lines so as to secure a proper gap there between upon deposition of a passivation layer.

21 Claims, 9 Drawing Sheets

INTERCONNECTION LAYER LAYOUT COMPRISING CUT-OUT CONDUCTIVE LINES THAT ENSURE PROPER PROFILE OF OVERLYING PASSIVATION LAYER

BACKGROUND OF THE INVENTION

1. Field of the Invention

The present invention relates to semiconductor devices, and more particularly, the present invention relates to the layout structure of interconnection layers which electrically connect elements in semiconductor devices, such as Dynamic Random Access Memories (DRAMs).

2. Description of the Related Art

As multiple metalizations become more frequently utilized in fabricating semiconductor devices, the characteristics of intermediate dielectric films (IMDs) (which provide insulation between adjacent interconnection metal layers) and passivation layers (formed over the wafer) become more important. That is, the IMD must be formed of a material having a low dielectric constant to decrease a parasitic capacitance between adjacent interconnection layers, and also must have good step coverage. The passivation layer, which is an insulating layer that inhibits physical or chemical damage to the uppermost interconnection layer during assembly and packaging, must provide the characteristics enumerated below:

1. Protection of the chip from an external environment, so that the chip operates normally regardless of a type of packaging material utilized and under a severe operating environment, as well as inhibiting differing causes of physical damage. This characteristic is especially pressing in the case of an exposed chip.

2. Protection of the interconnection layers, so that the patterning thereof is not adversely affected by distortion and stress that occurs during operation of the chip. In addition, chemical corrosion of the interconnection layers should be prevented.

3. A low dielectric constant to prevent signal propagation delays caused by parasitic capacitances which accompany the reduced widths of the conductive lines of the interconnection layer.

4. Planarization, i.e., capable of providing a substantially flat upper surface.

To this end, the passivation layer has generally been formed of a silicon nitride (SiN) layer deposited by PECVD (Plasma-Enhanced Chemical Vapor Deposition), and a thick polyimide layer laid thereon. The first passivation SiN layer serves as an impermeable barrier to mobile ions such as $Na^+$, and water, and prevents the chip from being scratched. The second passivation polyimide layer absorbs external impacts, and inhibits the formation of voids which occur in a die bonding process for connecting the metal layer of the bonding pad with the chip package.

However, as the space between adjacent conductive lines of the interconnection layer continues to decrease with the continuing increase in the scale of chip integration, the conventional passivation layer described above inherently suffers various drawbacks. Referring to FIG. 1, the conductive lines 12 of the conventional interconnection layer are arranged in parallel at a constant pitch. In this case, the pitch is defined as the sum of the width of one conductive line and the space between two adjacent conductive lines. With respect to the space between adjacent conductive lines, limitations inherent in CAD and photolithography processes result in this space being wider in the slantwise turning region 'B' than in the straight line region 'A'. As such, as described below, the subsequent passivation process results in a loss of passivation layer material in the wider region.

FIGS. 2A and 2B illustrate the cross sections of the two regions 'A' and 'B' of FIG. 1 after depositing the nitride passivation layer. A semiconductor substrate (not shown) is firstly covered with an insulating layer 10, on which the conductive lines 12 of the interconnection layer are laid out as shown in FIG. 1, and then an oxide layer 14 is deposited thereon by PECVD. Subsequently, the nitride passivation layer 16 is deposited on the oxide layer 14 by PECVD. In this case, the relatively narrower region 'A' generates the internal cavity 18 caused by the passivation layer 16 crowding the overhead region of the conductive lines 12, while the relatively wider region 'B' maintains the normal profile of the passivation layer 16 forming the normal gap 20 between the adjacent conductive lines.

The passivation layer 16 is covered with a photoresist layer (not shown), which is exposed to radiation and developed to form a photoresist pattern for defining pad and fuse regions. According to this pattern, the passivation layer 16 and oxide layer 14 are etched to open the pad and fuse regions. During the photolithography, the photoresist in the wider region 'B' is partially drawn into the cavity 18 of the narrower region 'A' in the direction of arrow 'C' of FIG. 1, resulting in a loss of the thickness of the photoresist layer in the region 'B', so that, when etching the passivation layer 16 to open the pad and fuse regions, the part of the passivation layer 16 in the region 'B' is not protected by the photoresist to generate passivation defects exposing the part of the conductive lines 12 in the region 'B'.

FIGS. 3A and 3B illustrate cross sectional views of the regions 'A' and 'B' of FIG. 1 after baking the polyimide layer. Even when removing the photoresist pattern used to open the pad and fuse regions by the etching and stripping process, the photoresist part having been drawn into the cavity 18 of the narrower region 'A' cannot be completely removed due to the blocking of the passivation layer 16. After removing the photoresist pattern, the polyimide layer 22 is deposited over it with a thickness of a few $\mu m$, and etched to expose the metal of the pad regions. Then, it is baked to harden the polyimide layer 22 at a temperature of about 350° C. for about 30 minutes. However, during the baking process, the photoresist residue in the cavity 18 of the narrower region 'A' burns generating pressurized gases moving into the gap between the adjacent conductor lines 12 in the region 'B', so as to burst the upper polyimide layer 22 as indicated by reference symbol 'D' in 3B. Consequently, this degrades the reliability of the product. In order to resolve such problem, an additional process or newly proposed passivation layer has been considered, which, however, may cause change of the electrical characteristics of the chip as well as result in increased cost.

SUMMARY OF THE INVENTION

It is an object of the present invention to provide a layout structure of the interconnection layers of a semiconductor device, which is devoid of certain procedural defects encountered upon formation of the interconnection layers.

It is another object of the present invention to provide a semiconductor device, which is devoid of certain procedural defects encountered upon depositing a passivation layer in a back-end process.

According to an aspect of the present invention, a layout structure of the interconnection layers includes a plurality of conducting lines extending adjacent one another in a semiconductor device, and at least one rectangular cut-out formed in a side of each of the conducting lines, wherein a width of gap between adjacent ones of the plurality of conducting lines is increased at each rectangular cut-out. Preferably, each rectangular cut-out is dimensioned to achieve a design gap between respective confronting flank portions of an insulating layer which covers adjacent ones of the plurality of conducting lines. The design gap has a predetermined width α, and each rectangular cut-out is dimensioned such that α=S−2T, where S is the increased width between adjacent ones of the plurality of conducting lines, and T is a width of each of the confronting flank portions of the insulating layer. Each rectangular cut-out is located in a region where a space between the adjacent conducting lines is narrow such that in the absence of each rectangular cut-out a cavity would otherwise form in the insulating layer formed over the conducting lines. Preferably, each rectangular cut-out in one of the conducting lines faces towards another rectangular cut-out in an adjacent one of the conducting lines. Also preferably, one rectangular cut-out in one of the conducting lines is opposite another rectangular cut-out in a same one of the conducting lines.

According to another aspect of the present invention, a layout structure of the interconnection layers includes a plurality of conducting lines extending adjacent one another in a semiconductor device, the plurality of conducting lines including a first region in which a spacing between adjacent conducting lines is narrow, and a second region in which a spacing between adjacent conducting lines is wider than in the first region, and at least one rectangular cut-out formed in a side of each of the conducting lines, wherein a width of gap between adjacent ones of the plurality of conducting line is increased at each rectangular cut-out. Preferably, each said rectangular cut-out is located in the first region.

According to still another aspect of the present invention, a semiconductor device includes a cell array region for containing a plurality of memory cells; a peripheral circuit region for containing circuits which drive the memory cells; a plurality of conducting lines extending adjacent one another in a given pattern in the cell array region and peripheral circuit region; a passivation layer formed over the conducting lines; and at least one rectangular cut-out formed in a side of each of the conducting lines. A width of gap between adjacent ones of the plurality of conducting lines is increased at each rectangular cut-out. Preferably, the rectangular cut-out is only arranged in the peripheral circuit region.

Thus, the layout structure of the interconnection layers is modified to selectively increase the space between adjacent conducting lines, so that the procedural defects encountered after depositing the passivation layer can be prevented without applying additional processes or materials, therefore improving the reliability of the chip.

BRIEF DESCRIPTION OF THE ATTACHED DRAWINGS

The present invention will now be described in more detail with reference to the accompanying drawings, in which.

DETAILED DESCRIPTION OF THE PREFERRED EMBODIMENTS

Figure 1:
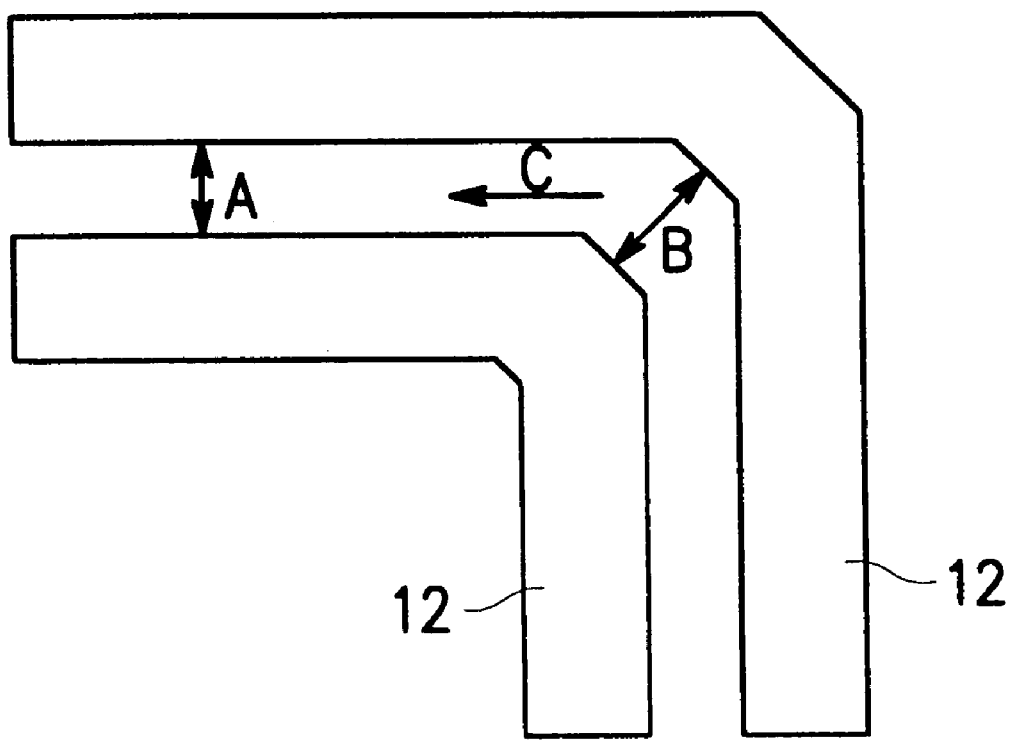
FIG. 1 is a plane view for illustrating the conventional layout structure of the conducting lines of the interconnection layers of a semiconductor device.
Figure 2A:
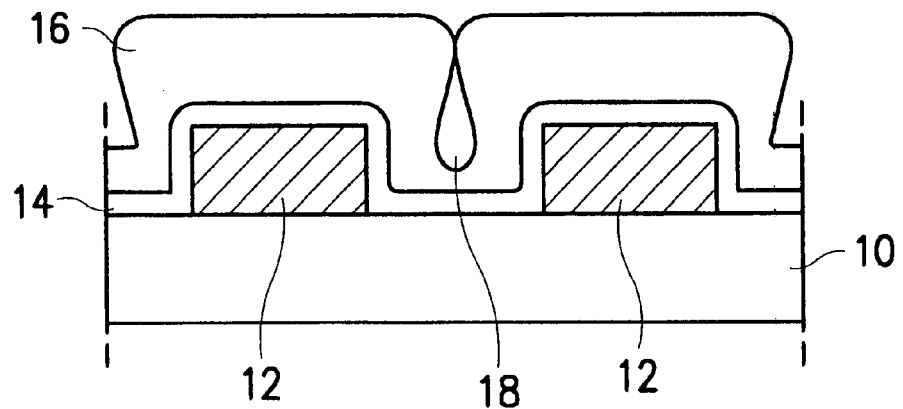
FIGS. 2A and 2B illustrate the cross sections of the two regions 'A' and 'B' of FIG. 1 after depositing a nitride passivation layer.
Figure 2B:
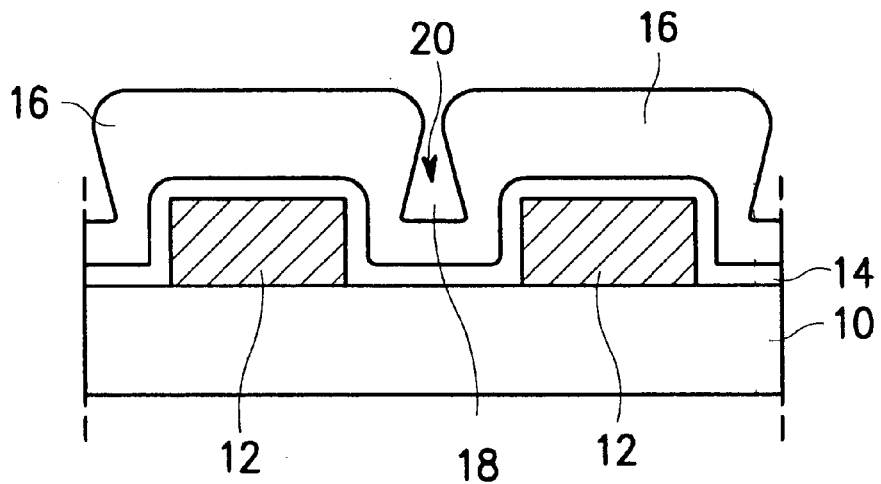
Figure 3A:
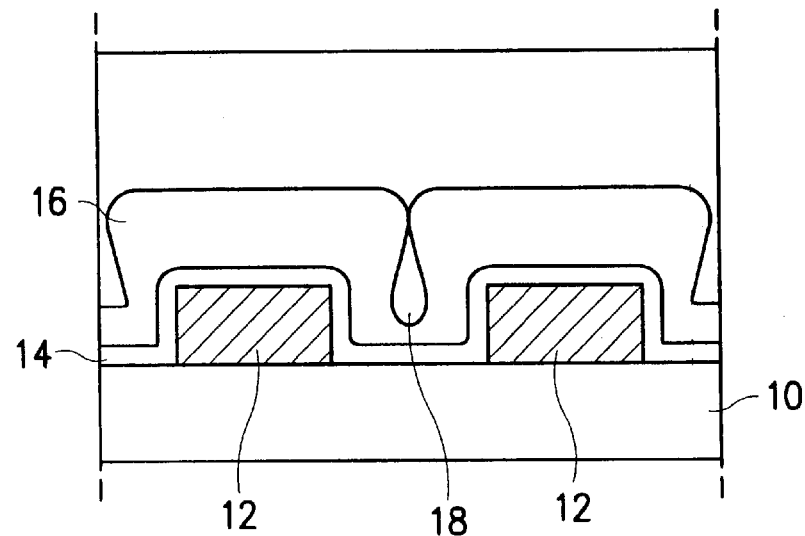
FIGS. 3A and 3B illustrate cross sectional views of the regions 'A' and 'B' of FIG. 1 after baking the polyimide layer.
Figure 3B:
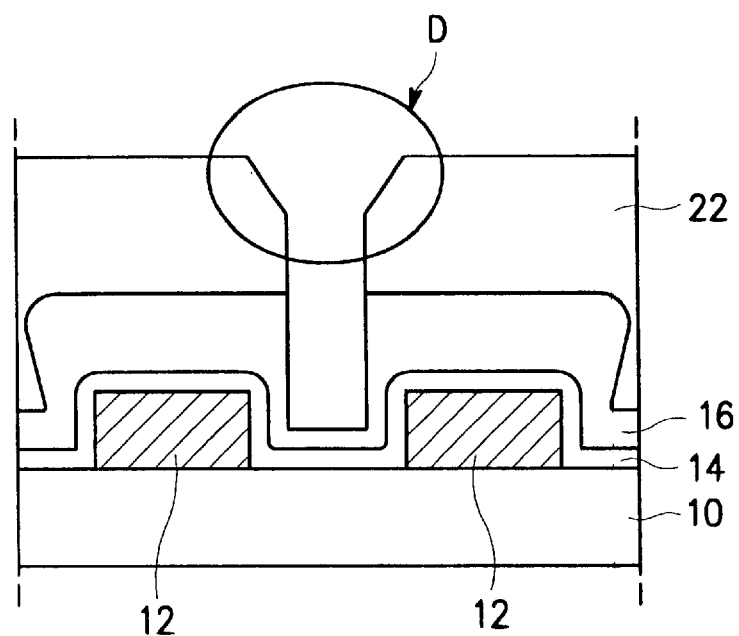
Figure 4:
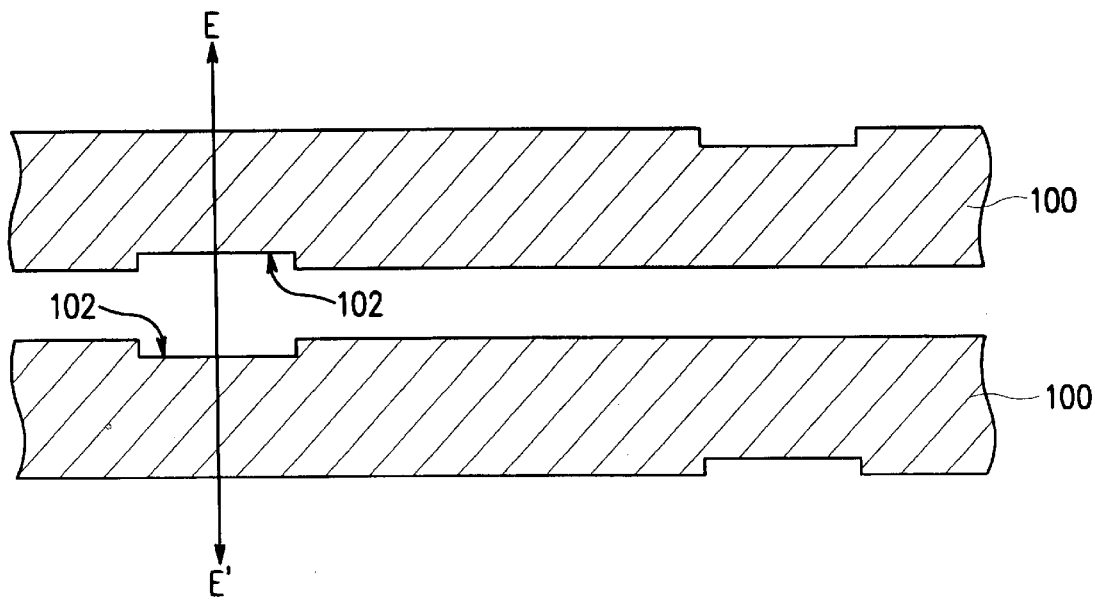
FIG. 4 is a plane view for illustrating the layout structure of the conducting lines of the interconnection layers of a semiconductor device of the present invention.
Figure 5:
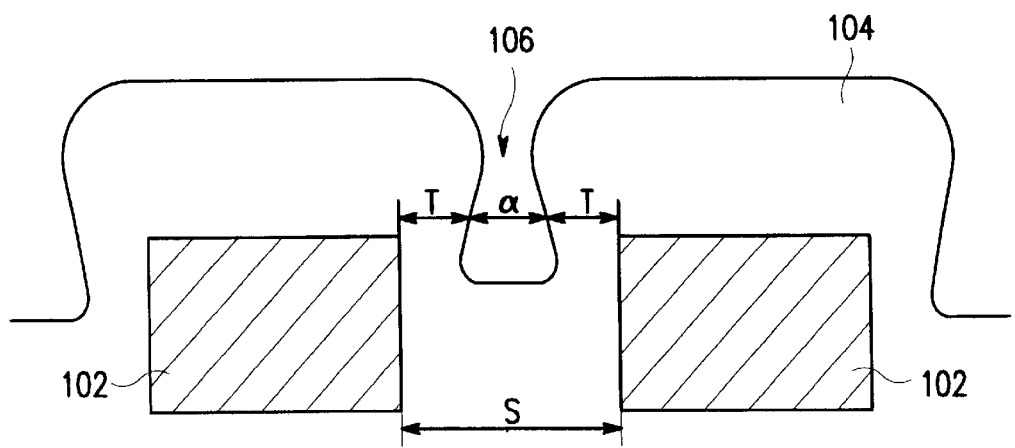
FIG. 5 is a cross sectional view taken along line E–E' of FIG. 4.

Referring to FIGS. 4 and 5, at least one rectangular cut-out 102 is formed in one side of each of the conducting lines 100 of the interconnection layer in order to adjust the width of the conducting line 100. Namely, the inventive layout pattern employs the rectangular cut-out to increase the space between the adjacent conducting lines 100. Of course, the other side of the conducting line 100 may also be provided with at least one rectangular cut-out. Preferably, a pair of rectangular cut-outs 102 are arranged respectively in two adjacent conducting lines 100 to face each other as shown in FIG. 4.

The rectangular cut-out 102 is dimensioned to achieve a design gap 106 between the flank portions of an insulating layer 104 covering two adjacent ones of the conducting lines. As shown in FIG. 5, the design gap 106 is defined by the equation S=2T+α, wherein S represents the space between the adjacent conducting lines, T the thickness of the flank portion of the insulating layer, and α the width of the design gap 106. Preferably, the rectangular cut-out 102 is only arranged in the regions where the space between the adjacent conducting lines 100 is so narrow as to generate a cavity in the insulating layer 104 formed over the conducting lines.

Figure 6:
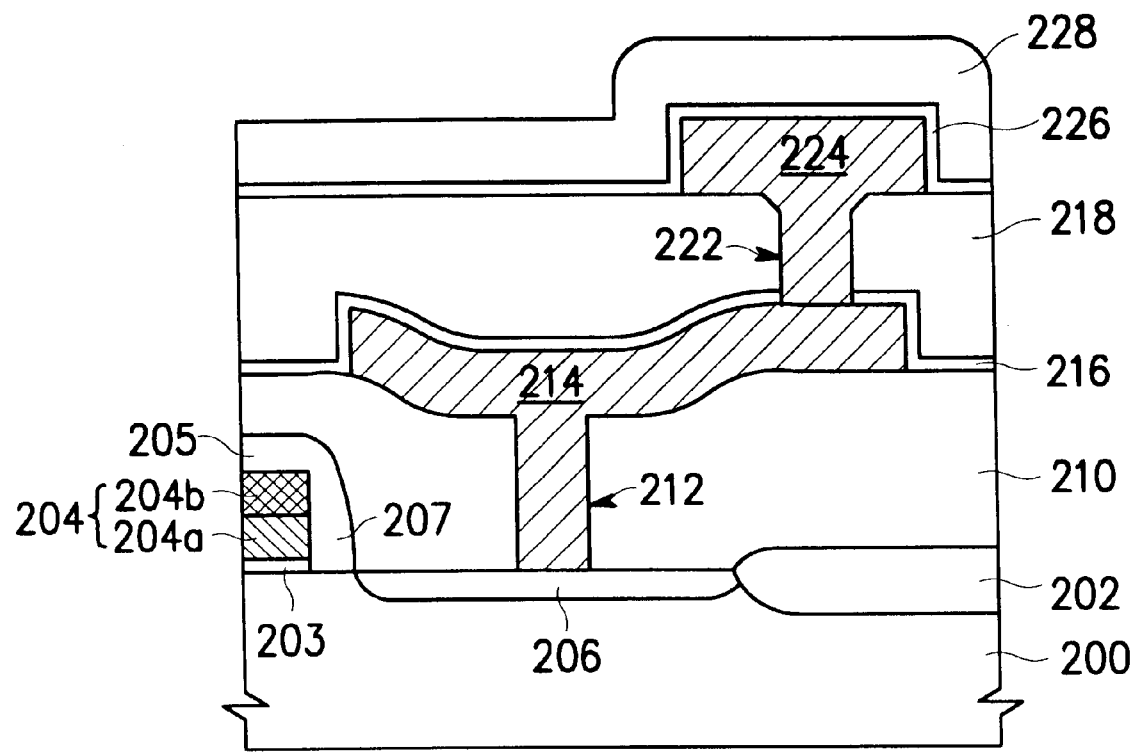
FIG. 6 is a cross sectional view of a peripheral region of a DRAM embodying the present invention.

FIG. 6 is a schematic cross sectional view of the peripheral circuit region of a DRAM having a double level metal interconnect structure. Sequentially deposited over the semiconductor substrate 100 with the field oxide layer separating the active and non-active regions are the gate insulating layer 203, polysilicon layer 204a, tungsten silicide layer 204b, and capping layer 205. The gate-insulating layer 203 is formed by a thermal oxidation process. The polysilicon layer 204a is doped with an impurity of high concentration by a conventional doping process such as diffusion, ion implantation, and in situ doping. Of course, the tungsten silicide may be replaced by another refractory metal silicide such as titanium silicide and tantalum silicide.

The capping layer 205 is subjected to the photolithographic etching process to generate the gate electrode pattern to etch the tungsten silicide 204b and polysilicon layer 204a to obtain the gate electrode 204. Deposited over the gate electrode 204 is an oxide layer, which is etched back to form spacers 207 on both sides of the gate electrode 204. The spacers 207 and gate electrode 204 are used as a mask to implant impurity ions to form the source/drain regions 206 on the substrate with the gate electrode between them.

After forming the conducting elements such as bit lines and capacitors (not shown), a dielectric insulating layer 210 is deposited over the substrate to insulate such elements from the first interconnection layer. The insulating layer 210 is subjected to the photolithographic etching to form the contact holes 212 to expose the gate electrodes 204 and source/drain regions 206. Subsequently, the CVD (Chemical Vapor Deposition) process is carried out to deposit a metal layer such as tungsten (W) layer, which is patterned by the photolithographic etching to form the first interconnection layer 214.

Deposited over the first interconnection layer 214 is the first oxide layer 216 by PECVD, over which a layer of undoped silicate glass (USG) is deposited with a thickness of about 6000 Å to form an IMD 218, covered with a spin-on glass (SOG) coating (not shown) hardened by baking. The SOG coating is etched back to flatten the IMD 218, which is sequentially subjected to wet and dry etching to form via-holes 222 to expose the surface of the first interconnection layer 214. The wet etching of the IMD 218 is required to lower the aspect ratio of the via-holes 222, and to facilitate the embedding of aluminum (Al) to constitute the second interconnection layer in the subsequent process. The Al layer is deposited with a thickness of about 6000 Å by sputtering, heated to a temperature of 500 to 600° C. near the melting point to flow into the bottom of the via-holes 222, until they are completely filled with the Al layer. The Al layer is subjected to the photolithographic etching to pattern the second interconnection layer 224 electrically connected through the via-holes 222 to the first interconnection layer 214.

Figure 7:
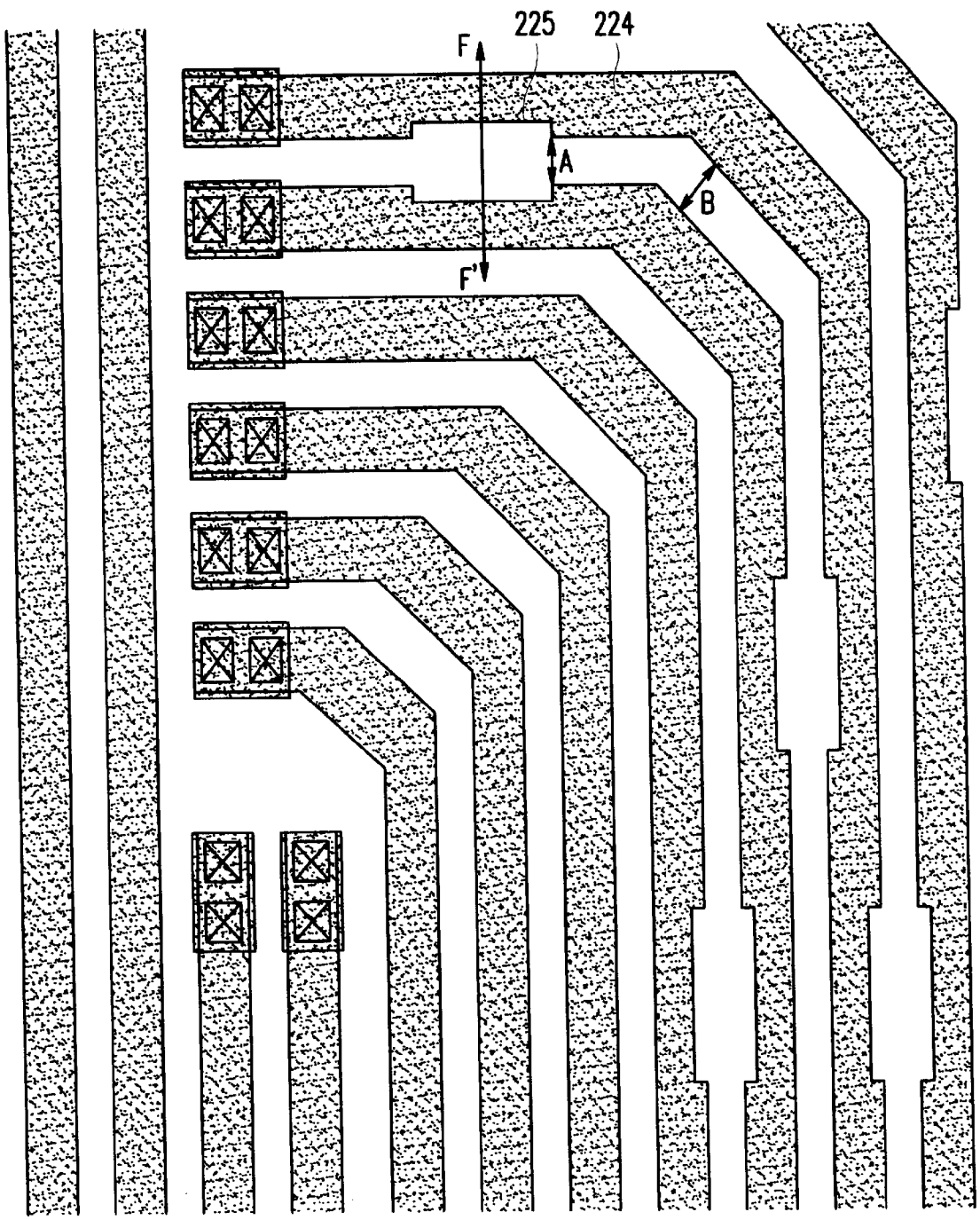
FIG. 7 is a plane view for illustrating the layout structure of the second interconnection layer shown in FIG. 6.

Referring to FIG. 7, the conducting line of the second interconnection layer 224 is provided with at least one rectangular cut-out 225 in one side or both in order to increase the space between the two adjacent conducting lines while maintaining a same pitch between them. Preferably, the rectangular cut-out 225 is only arranged in the region where the space between the adjacent conducting lines becomes so narrow as to generate a cavity in the passivation layer 228 deposited over the conducting lines.

Generally, the conducting lines are arranged with turning portions in the peripheral circuit region of a DRAM, so that the design limitation cannot but make the space between two adjacent conducting lines narrower in region 'A' than in region 'B'. Hence, in the subsequent photolithographic process, the photoresist layer in the wider region 'B' is partially drawn into the cavity formed in the narrower region 'A', so that the subsequent photoresist removing process cannot completely remove the photoresist existing in the narrower region 'A'. In order to resolve such problem, the conducting lines of the second interconnection layer 224 are provided with the rectangular cut-outs 225 in the narrower region 'A'.

Figure 8:
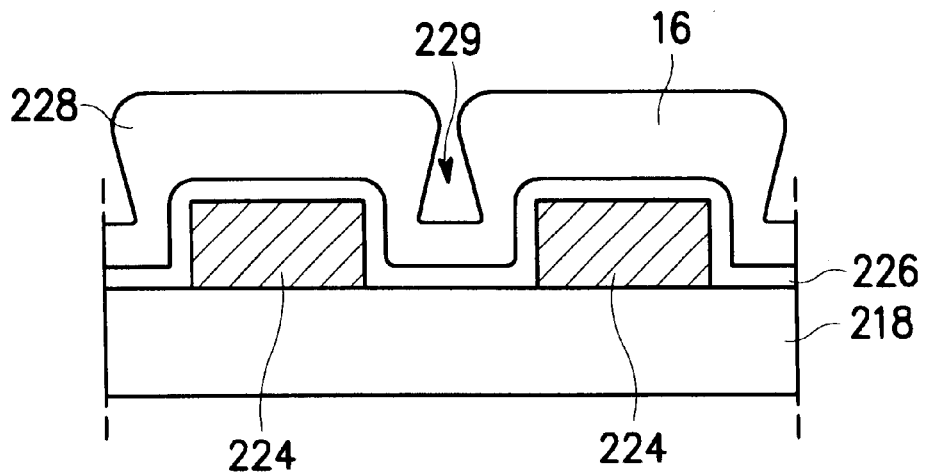
FIG. 8 is a cross sectional view taken along line F–F' of FIG. 7 after depositing a nitride passivation layer.

Describing the process after forming the second interconnection layer 224 in reference to FIGS. 7 and 8, the second oxide layer 226 is deposited there over by PECVD, and annealed at a temperature of about 400° C. for 60 minutes in an atmosphere containing hydrogen gas to improve the refresh characteristics. In this case, the second interconnection layer 224 is covered with the second oxide layer 226 before annealing to prevent generation of the hillocks.

Deposited over the second oxide layer 226 is a nitride passivation layer 228 with a thickness of about 6000 Å by PECVD, which comes to have a normal profile with a design gap 229 between the adjacent conducting lines with the aide of the rectangular cut-outs 225. Hence, the subsequent photolithographic etching process does not cause excessive etching of the passivation layer 228 due to the loss of the photoresist.

Although not shown, a photoresist layer is deposited over the passivation layer 228, exposed to radiation, and developed to form a photoresist pattern defining the pad and fuse regions. According to this pattern, the passivation layer 228 and second oxide layer 226 are etched to open the pad and fuse regions. Since the passivation layer 228 is laid with the design gaps 229 between the adjacent conducting lines all throughout the second interconnection layer 224, the photoresist layer is uniformly deposited over the passivation layer 228, thus preventing excessive etching of the passivation layer 228 due to the irregularity of the thickness of the photoresist layer.

Figure 9:
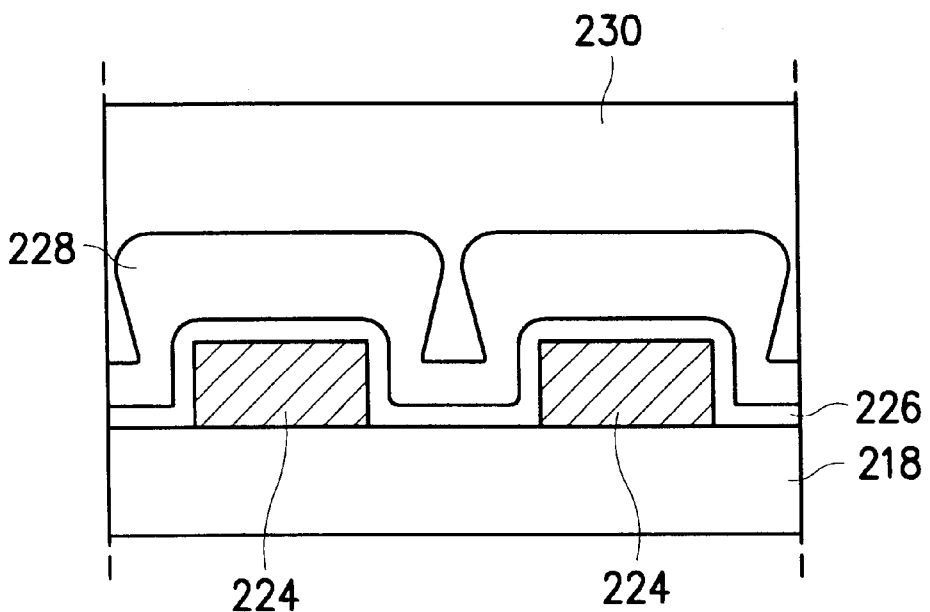
FIG. 9 is a cross sectional view taken along line F–F' of FIG. 7 after baking the polyimide layer.

Referring to FIG. 9, the photoresist pattern used to open the pad and fuse regions is removed by etching and stripping processes. In this case, the photoresist residue is not generated due to the rectangular cut-outs 225 provided in the second interconnection layer 224. This is in contrast to the conventional layout structure in which photoresist remains in the region where the space between the adjacent conducting lines becomes narrower. Thereafter, the polyimide layer 230 is deposited there over with a thickness of a few μm, subjected to photolithographic etching to expose the metal layer in the pad regions, and hardened by baking at a temperature of about 350° C. for 30 minutes. Generally, the solid polyimide is obtained by baking the liquid polyamic-acid spin-coated for imidization. The polyimide layer 230 serves as the uppermost passivation layer of the wafer to absorb external impacts and prevent generation of voids during the die bonding process for connecting the metal layer of the bonding pad and the chip package. Thus completing the wafer fabrication, the wafer is subjected to the electrical die sorting (EDS) to discard defective chips, and finally transferred to the assembling process.

Figure 10A:
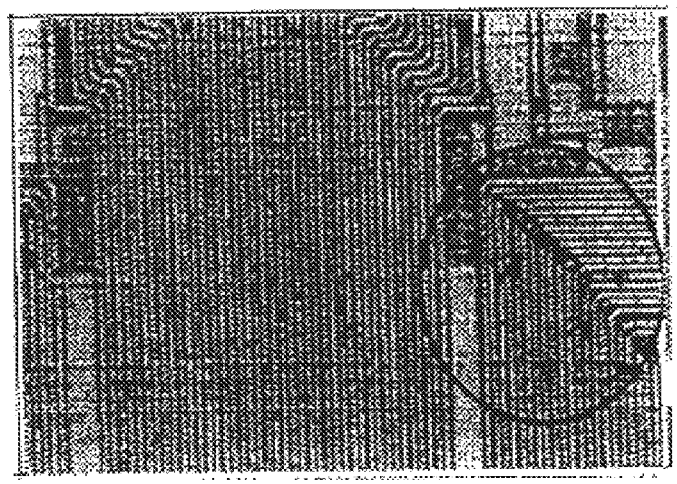
FIGS. 10A and 10B are respectively a plane and a cross sectional view of the conventional interconnection layer taken by using a scanning electron microscope (SEM)
Figure 10B:
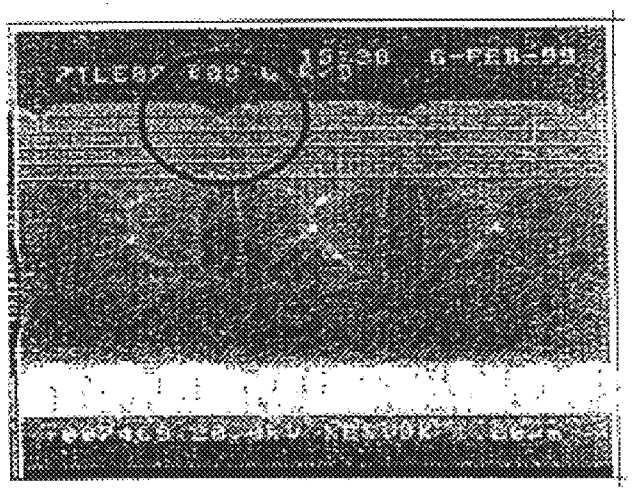

Inspecting the plane and cross sectional views of the conventional layout structure of the interconnection layer taken by SEM, as shown in FIGS. 10A and 10B, the space between the adjacent conducting lines in their slantingly turning region becomes wider than in the other regions due to the design limitation, as indicated by a black circle in FIG. 10A, so that the passivation layer deposited over the conducting lines cannot but generate cavities in the other regions, as indicated by a black circle in FIG. 10B. Consequently, the subsequent photolithographic process causes the photoresist to flow into the narrower regions due to the irregular thickness of the photoresist layer, so that the polyimide layer is burst in the wider regions due to the photoresist residue not removed from the narrower region in the subsequent baking process.

Figure 11A:
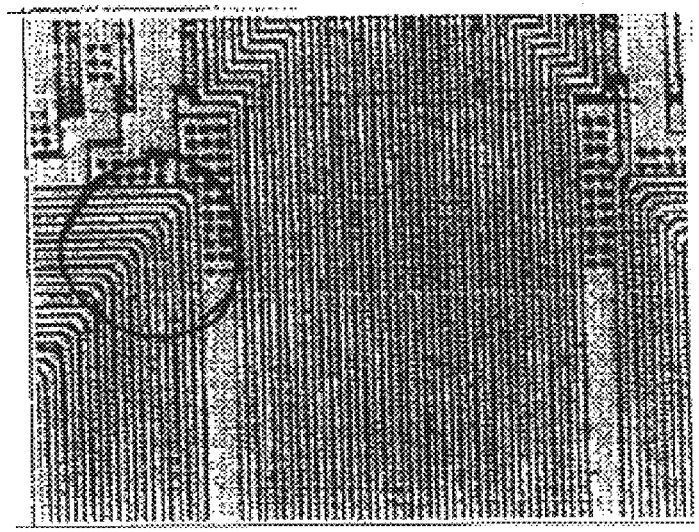
FIGS. 11A and 11B are respectively a plane and a cross sectional view of the interconnection layer of the present invention taken by using a SEM.
Figure 11B:
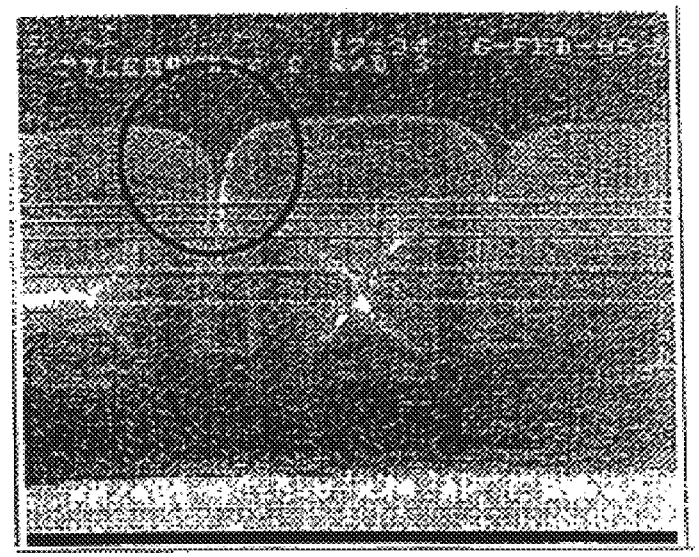

On the contrary, referring to FIGS. 11A and 11B, the inventive layout structure of the interconnection layer is provided with the rectangular cut-outs so as to secure a proper gap, as indicated by a black circle in FIG. 11B, between the adjacent conducting lines covered with the passivation layer in the region, as indicated by a black circle in FIG. 11A, where the space between them becomes relatively narrower. Hence, the photoresist layer is uniformly formed over the passivation layer in the subsequent photolithographic process, thereby preventing the excessive etching of the passivation layer as well as the burst thereof.

Thus, without the use of additional processes or materials, the inventive rectangular cut-outs avoid procedural defects which occur when forming the interconnection layer, improving the reliability of the device.

While the present invention has been described in connection with specific embodiments accompanied by the attached drawings, it will be readily apparent to those skilled in the art that various changes and modifications may be made thereto without departing the gist of the present invention.

What is claimed is:

1. A layout structure of interconnection layers, comprising:
    a plurality of conducting lines extending adjacent one another in a semiconductor device;
    at least one rectangular cut-out formed in a side of each of said conducting lines, wherein the width of a gap between adjacent ones of said plurality of conducting lines is increased at each said rectangular cut-out; and
    an insulating layer covering said plurality of conducting lines, wherein each said rectangular cut-out is dimensioned to achieve a design gap between respective confronting flank portions of said insulating layer which cover adjacent ones of said plurality of conducting lines.

2. A layout structure as defined in claim 1, wherein said design gap has a predetermined width α, and wherein each said rectangular cut-out is dimensioned such that α=S−2T, where S is the increased width between said adjacent ones of said plurality of conducting lines, and T is a width of each of said confronting flank portions of said insulating layer.

3. A layout structure as defined in claim 1, wherein each said rectangular cut-out is located in a region where a space between the adjacent conducting lines is narrow such that in the absence of each said rectangular cut-out a cavity would otherwise form in said insulating layer formed over said conducting lines.

4. A layout structure as defined in claim 1, wherein each said rectangular cut-out in one of said conducting lines faces towards another said rectangular cut-out in an adjacent one of said conducting lines.

5. A layout structure as defined in claim 1, wherein one said rectangular cut-out in one of said conducting lines is opposite another said rectangular cut-out in a same one of said conducting lines.

6. A layout structure of interconnection layers, comprising:
    a plurality of conducting lines extending adjacent one another in a semiconductor device, said plurality of conducting lines including a first region in which a spacing between adjacent conducting lines is narrow, and a second region in which a spacing between adjacent conducting lines is wider than in said first region;
    at least one rectangular cut-out formed in a side of each of said conducting lines, wherein the width of a gap between adjacent ones of said plurality of conducting lines is increased at each said rectangular cut-out; and
    an insulating layer covering said plurality of conducting lines, wherein each said rectangular cut-out is dimensioned to achieve a design gap between respective confronting flank portions of said insulating layer which cover adjacent ones of said plurality of conducting lines.

7. A layout structure as defined in claim 6, wherein each said rectangular cut-out is located in said first region.

8. A layout structure as defined in claim 6, wherein said design gap has a predetermined width α, and wherein each said rectangular cut-out is dimensioned such that α=S−2T, where S is the increased width between said adjacent ones of said plurality of conducting lines, and T is a width of each of said confronting flank portions of said insulating layer.

9. A layout structure as defined in claim 6, wherein each said rectangular cut-out in one of said conducting lines faces towards another said rectangular cut-out in an adjacent one of said conducting lines.

10. A layout structure as defined in claim 6, wherein one said rectangular cut-out in one of said conducting lines is opposite another said rectangular cut-out in a same one of said conducting lines.

11. A semiconductor device comprising:
    a cell array region for containing a plurality of memory cells;
    a peripheral circuit region for containing circuits which drive said memory cells;
    a plurality of conducting lines extending adjacent one another in a given pattern in said cell array region and peripheral circuit region;
    a passivation layer formed over said conducting lines; and
    at least one rectangular cut-out formed in a side of each of said conducting lines, wherein a width of gap between adjacent ones of said plurality of conducting lines is increased at each said rectangular cut-out.

12. A semiconductor device as defined in claim 11, wherein each said rectangular cut-out is dimensioned to achieve a design gap between respective confronting flank portions of said passivation layer which cover adjacent ones of said plurality of conducting lines.

13. A semiconductor device as defined in claim 12, wherein said design gap has a predetermined width α, and wherein each said rectangular cut-out is dimensioned such that α=S−2T, where S is the increased width between said adjacent ones of said plurality of conducting lines, and T is a width of each of said confronting flank portions of said insulating layer.

14. A semiconductor device as defined in claim 11, wherein each said rectangular cut-out in one of said conducting lines faces towards another said rectangular cut-out in an adjacent one of said conducting lines.

15. A semiconductor device as defined in claim 12, wherein each said rectangular cut-out is located in a region where a space between the adjacent conducting lines is narrow such that in the absence of each said rectangular cut-out a cavity would otherwise form in said passivation layer formed over said conducting lines.

16. A semiconductor device as defined in claim 11, wherein each said rectangular cut-out is located in said peripheral circuit region.

17. A semiconductor device as defined in claim 16, wherein one said rectangular cut-out in one of said conducting lines is opposite another said rectangular cut-out in a same one of said conducting lines.

18. A semiconductor device comprising:
    an interconnection layer comprising a plurality of adjacent conducting lines extending parallel to one another, the conducting lines extending linearly in a first region of the interconnection layer, and the conducting lines forming a turn in a second region of the interconnection layer contiguous to said first region, wherein the spacing between adjacent ones of said conducting lines is smaller in said first region than in said second region, and wherein said adjacent ones of said conducting lines have confronting sides in which a cut-out is defined in said first region at a location adjacent said second region, the width of a gap between said adjacent ones of the conducting lines in said first region being increased by said cut-out; and an insulating layer disposed over said conducting lines, said insulating layer having confronting flank portions that are spaced entirely from one another in a region thereof that overlies said location in which the cut-outs exist in said conducting lines, a gap open to the top of said insulating layer existing between the confronting flank portions of said insulating layer over the transition between said first and second regions of said conducting lines.

19. The semiconductor device of claim 18, wherein said cut-out is rectangular.

20. The semiconductor device of claim 18, wherein a respective said cut-out is defined in both of the confronting sides of said adjacent ones of the conducting lines.

21. The semiconductor device of claim 19, wherein a respective said rectangular cut-out is defined in both of the confronting sides of said adjacent ones of the conducting lines.

* * * * *